United States Patent
Hong et al.

(10) Patent No.: US 9,941,018 B2
(45) Date of Patent: Apr. 10, 2018

(54) GATE DRIVING CIRCUIT AND DISPLAY DEVICE USING THE SAME

(71) Applicant: LG DISPLAY CO., LTD., Seoul (KR)

(72) Inventors: Seokhyun Hong, Suwon-si (KR); Chulwon Lee, Seoul (KR); Juyoung Noh, Paju-si (KR); Osung Do, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 125 days.

(21) Appl. No.: 14/857,411

(22) Filed: Sep. 17, 2015

(65) Prior Publication Data

US 2016/0078834 A1  Mar. 17, 2016

(30) Foreign Application Priority Data

Sep. 17, 2014  (KR) ........................ 10-2014-0123780

(51) Int. Cl.
  *G09G 5/00*  (2006.01)
  *G11C 19/00*  (2006.01)
  *G09G 3/20*  (2006.01)
  *G11C 19/28*  (2006.01)
  *G09G 3/3266*  (2016.01)
  *G09G 3/36*  (2006.01)

(52) U.S. Cl.
  CPC .............. *G11C 19/00* (2013.01); *G09G 3/20* (2013.01); *G11C 19/287* (2013.01); *G09G 3/3266* (2013.01); *G09G 3/3674* (2013.01); *G09G 2310/0218* (2013.01); *G09G 2310/0267* (2013.01); *G09G 2310/0286* (2013.01)

(58) Field of Classification Search
  CPC ........ G11C 19/00; G11C 19/287; G09G 3/20; G09G 2310/0218; G09G 2310/0267; G09G 3/3674; G09G 2310/0286; G09G 3/3266
  USPC ........................................................ 345/212
  See application file for complete search history.

(56) References Cited

U.S. PATENT DOCUMENTS

| | | | | |
|---|---|---|---|---|
| 5,533,187 | A  * | 7/1996 | Priem ..................... | G09G 5/024 345/501 |
| 2006/0028463 | A1* | 2/2006 | Nakamura ........... | G09G 3/3677 345/204 |
| 2006/0081852 | A1* | 4/2006 | Hotta .................. | H01L 27/1214 257/72 |
| 2007/0085812 | A1* | 4/2007 | O .......................... | G09G 3/3648 345/100 |
| 2011/0227505 | A1* | 9/2011 | Park .................... | H05B 33/0896 315/297 |
| 2011/0273408 | A1* | 11/2011 | Ra ........................ | G09G 3/3266 345/204 |

* cited by examiner

*Primary Examiner* — Srilakshmi K Kumar
*Assistant Examiner* — Chineyere Wills-Burns
(74) *Attorney, Agent, or Firm* — Birch, Stewart, Kolasch & Birch, LLP

(57) ABSTRACT

A gate driving circuit and a display device using the same are discussed. The gate driving circuit according to an embodiment includes a first shift register configured to sequentially shift a gate start pulse in response to a gate shift clock and output a gate pulse shifted on a per block basis, each block including a plurality of gate lines, a second shift register configured to sequentially shift the gate start pulse in response to the gate shift clock and output a gate pulse shifted on a per gate line basis, and a controller configured to supply the gate shift clock to one of the first and second shift registers.

16 Claims, 7 Drawing Sheets

GATE DRIVING CIRCUIT AND DISPLAY DEVICE USING THE SAME

This application claims the priority benefit of Korean Patent Application No. 10-2014-0123780 filed on Sep. 17, 2014, the entire contents of which is incorporated herein by reference for all purposes as if fully set forth herein.

BACKGROUND OF THE INVENTION

Field of the Invention

Embodiments of the invention relate to a gate driving circuit and a display device using the same.

Discussion of the Related Art

Various flat panel displays, such as a liquid crystal display (LCD), a plasma display panel (PDP), an organic light emitting diode (OLED) display, and an electrophoresis display (EPD), have been developed. The liquid crystal display displays an image by controlling an electric field applied to liquid crystal molecules based on a data voltage. An active matrix liquid crystal display includes a thin film transistor (TFT) in each pixel.

The liquid crystal display includes a liquid crystal display panel, a backlight unit irradiating light onto the liquid crystal display panel, source driver integrated circuits (ICs) for supplying a data voltage to data lines of the liquid crystal display panel, gate driver ICs for supplying gate pulses (or scan pulses) to gate lines (or scan lines) of the liquid crystal display panel, a control circuit for controlling the source driver ICs and the gate driver ICs, a light source driving circuit for driving light sources of the backlight unit, and the like.

The gate driver IC sequentially supplies the gate pulses to the first to last gate lines during one frame period, so as to sequentially select lines of a pixel array. It is difficult to change a driving method of the display device because of the gate driver IC. For example, pixels disposed on a plurality of lines may be simultaneously discharged or initialized, but this method requires the development of a new gate driver IC.

SUMMARY OF THE INVENTION

Embodiments of the invention provide a gate driving circuit and a display device using the gate driving circuits, which are capable of variously changing an output method.

In one aspect, there is a gate driving circuit comprising a first shift register configured to sequentially shift a gate start pulse in response to a gate shift clock and output a gate pulse shifted on a per block basis, each block including a plurality of gate lines, a second shift register configured to sequentially shift the gate start pulse in response to the gate shift clock and output a gate pulse shifted on a per gate line basis, and a controller configured to supply the gate shift clock to one of the first and second shift registers.

In another aspect, there is a display device comprising a display panel including a pixel array including pixels arranged in a matrix form based on a crossing structure of data lines and gate lines, a first shift register configured to sequentially shift a gate start pulse in response to a gate shift clock and output a gate pulse shifted on a per block basis, each block including a plurality of gate lines, a second shift register configured to sequentially shift the gate start pulse in response to the gate shift clock and output a gate pulse shifted on a per gate line basis, and a controller configured to supply the gate shift clock to one of the first and second shift registers.

A first output voltage of the first shift register can be supplied to OR gates of a first block connected to a plurality of gate lines belonging to the first block through a first common line.

Output voltages sequentially output from the second shift register can be supplied to an OR gate of the first block.

A second output voltage of the first shift register can be supplied to OR gates of a second block connected to a plurality of gate lines belonging to the second block through a second common line.

Output voltages sequentially output from the second shift register can be supplied to an OR gate of the second block.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

A display device according to an exemplary embodiment of the invention may be implemented as a flat panel display capable of representing colors, such as a liquid crystal display (LCD), a plasma display panel (PDP), and an organic light emitting diode (OLED) display.

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
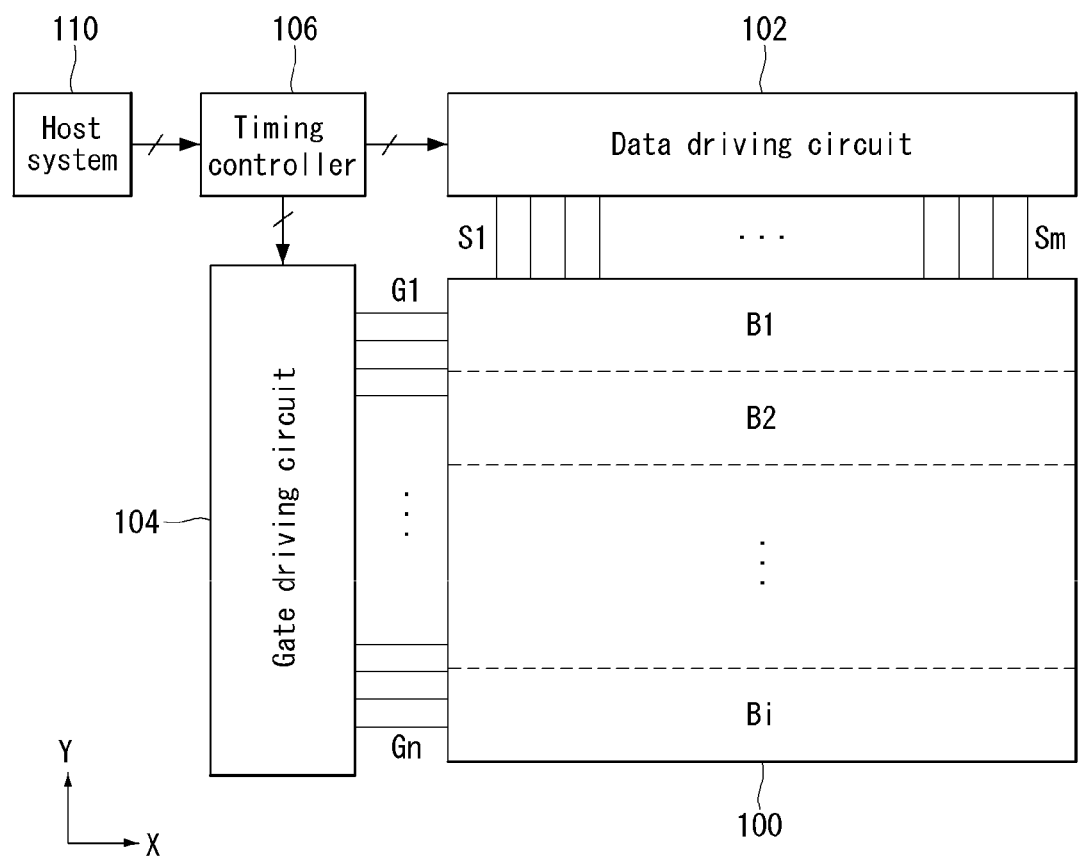
FIG. 1 is a block diagram showing a display device according to an exemplary embodiment of the invention.
Figure 2:
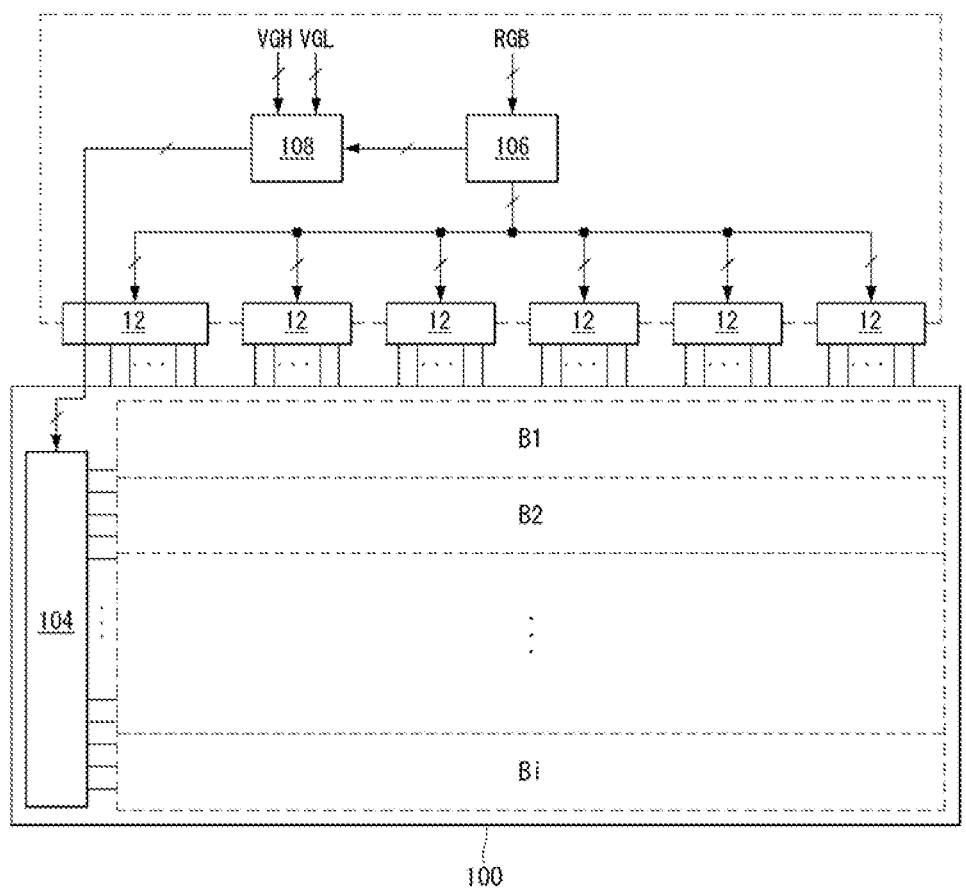
FIG. 2 shows an example where a gate driving circuit is implemented as a gate-in-panel (GIP) circuit according to an embodiment of the present invention.
Figure 3:
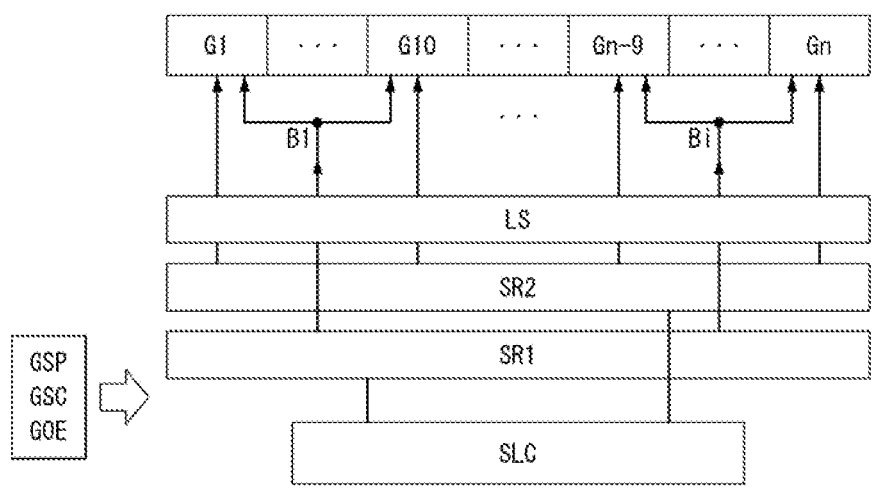
FIGS. 3 and 4 show a circuit configuration of a gate driving circuit according to an embodiment of the present invention.

Referring to FIGS. 1 to 3, a display device according to an exemplary embodiment of the invention includes a display panel 100 including a pixel array and a display panel driving circuit for writing data of an input image on the display panel 100. All the components of the display device in all the embodiments of the present invention are operatively coupled and configured.

The input image is displayed on the pixel array of the display panel 100. The pixel array of the display panel 100 includes pixels arranged in a matrix form based on a crossing structure of data lines S1 to Sm and gate lines G1 to Gn. Each pixel may include a pixel electrode, to which a data voltage is supplied, at least one thin film transistor (TFT) operating as a switching element and/or a driving element, and at least one capacitor.

The display panel driving circuit includes a data driving circuit 102, a gate driving circuit 104, and timing controller 106.

The data driving circuit 102 includes a plurality of source driver integrated circuits (ICs) 12 as shown in FIG. 2. Data output channels of the source driver ICs 12 are connected to the m data lines S1 to Sm, where m is a positive integer. The source driver ICs 12 receive digital video data of the input image from the timing controller 106. The source driver ICs 12 convert the digital video data of the input image into positive and negative gamma compensation voltages under the control of the timing controller 106 and output positive and negative data voltages. An output voltage of the source driver ICs 12 is supplied to the data lines S1 to Sm.

Each source driver IC 12 inverts a polarity of the data voltage to be supplied to the pixels under the control of the timing controller 106 and outputs it to the data lines S1 to Sm.

The gate driving circuit 104 supplies gate pulses to the n gate lines G1 to Gn under the control of the timing controller 106, where n is a positive integer. In a block driving mode, the gate driving circuit 104 sequentially outputs the gate pulses in a per block basis. In a line sequential driving mode, the gate driving circuit 104 sequentially outputs the gate pulses in a per line basis. Each of blocks B1 to Bi includes N gate lines, where N is a positive integer of 2 to n/2. The line in the line sequential driving mode means one gate line. For example, in the block driving mode, the gate driving circuit 104 simultaneously outputs the gate pulses to the gate lines belonging to the first block B1 and then simultaneously outputs the gate pulses to the gate lines belonging to the second block B2. In the line sequential driving mode, the gate driving circuit 104 sequentially outputs the gate pulses to the respective gate lines.

The timing controller 106 receives timing signals synchronized with the data of the input image from a host system 110. The timing controller 106 transmits the data of the input image received from the host system 110 to the data driving circuit 102. The timing signals include a vertical sync signal Vsync, a horizontal sync signal Hsync, a data enable signal DE, and a main clock CLK, etc. The timing controller 106 controls operation timings of the data driving circuit 102 and the gate driving circuit 104 based on the timing signals Vsync, Hsync, DE, and CLK received along with pixel data of the input image.

The host system 110 may be implemented as one of a television system, a set-top box, a navigation system, a DVD player, a Blu-ray player, a personal computer (PC), a home theater system, and a phone system.

An IC, into which the gate driving circuit 104 is integrated, may be attached to the display panel 100 through a tape automated bonding (TAB) process and may be connected to the gate lines G1 to Gn. Further, the gate driving circuit 104 may be directly formed on a substrate of the display panel 100 including the pixel array through a gate-in-panel (GIP) process.

FIG. 2 shows the gate driving circuit 104 directly formed on the display panel 100 through the GIP process. The gate driving circuit 104 includes first and second shift registers generating an output in response to gate timing control signals GSP, GSC, and GOE and a controller selecting the first and second shift registers. Functions of the first and second shift registers and a function of the controller are substantially the same as shift registers and a controller of an IC shown in FIG. 3. In FIG. 2, a level shifter 108 converts voltage levels of the gate timing control signals GSP, GSC, and GOE transferred from the timing controller 106 to the gate driving circuit 104 into a voltage swinging between a gate high voltage VGH and a gate low voltage VGL. The gate high voltage VGH is equal to or greater than a threshold voltage capable of turning on the TFT of the pixel array, and the gate low voltage VGL is less than the threshold voltage of the TFT of the pixel array.

The gate timing control signals GSP, GSC, and GOE generated from the timing controller 106 include a gate start pulse GSP, a gate shift clock GSC, and a gate output enable signal GOE. The gate start pulse GSP controls output timing of a first gate pulse, and the gate shift clock GSC controls shift timing of the gate pulse. The gate output enable signal GOE controls output timing of each of the gate pulses.

Figure 4:
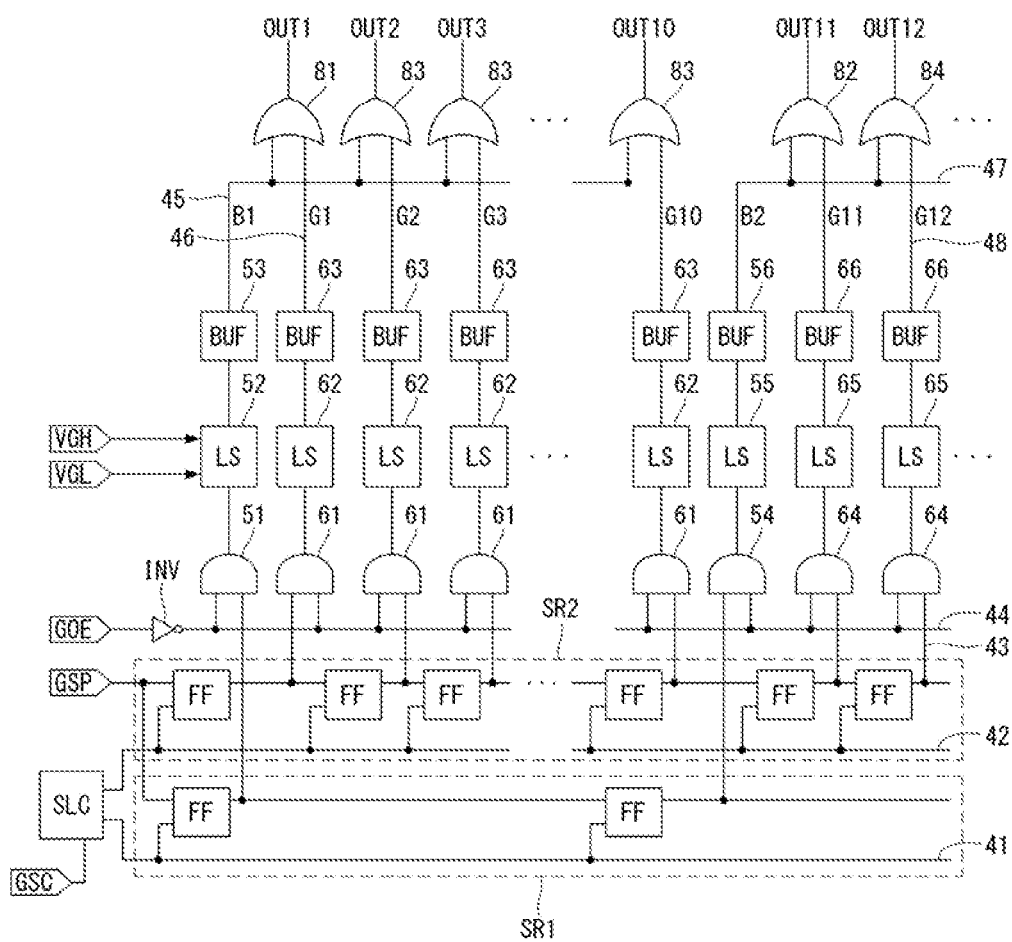

FIGS. 3 and 4 show an IC internal configuration of the gate driving circuit 104 attached to the display panel 100 through the TAB process.

Referring to FIGS. 3 and 4, the gate driving circuit 104 includes a controller SLC, a first shift register SR1, a second shift register SR2, and a level shifter 62.

In the block driving mode, the controller SLC supplies the gate shift clock GSC to the first shift register SR1 through a first GSC line 41 under the control of the timing controller 106. In the line sequential driving mode, the controller SLC supplies the gate shift clock GSC to the second shift register SR2 through a second GSC line 42 under the control of the timing controller 106. The controller SLC may be embedded in the timing controller 106 or the data driving circuit 102.

The first and second shift registers SR1 and SR2 commonly receive the gate start pulse GSP and individually receive the gate shift clock GSC through the controller SLC. Thus, the first and second shift registers SR1 and SR2 individually operate based on the selection of the controller SLC.

The first shift register SR1 includes a plurality of D flip-flops FF connected in cascade. The first shift register SR1 sequentially shifts the gate start pulse GSP in response to the gate shift clock GSC and outputs the gate pulse, which is shifted on a per block basis.

The second shift register SR2 includes a plurality of D flip-flops FF connected in cascade. The second shift register SR2 sequentially shifts the gate start pulse GSP in response to the gate shift clock GSC and outputs the gate pulse, which is shifted on a per line basis.

Each of AND gates 51, 54, 61, and 64 performs an AND operation on a signal input through a GOE line 44 and an output 43 of the first and second shift registers SR1 and SR2 and outputs a result of the AND operation to level shifters 52, 55, 62, and 65. An inverter INV inverts the gate output enable signal GOE and supplies it to the AND gates 51, 54, 61, and 64 through the GOE line 44.

The level shifters 52, 55, 62, and 65 change an output voltage of the AND gate 61. Output voltages of the level shifters 52, 55, 62, and 65 are supplied to OR gates 81, 82, 83, and 84 through a buffer 53.

Hereinafter, the embodiment of the invention is described on the assumption that ten gate lines belong to one block. In FIGS. 4 to 7, "OUT1 to OUT10" are output voltages of the gate driving circuit 104 supplied to the gate lines G1 to G10 belonging to the first block B1, and "OUT11 to OUT20" are output voltages of the gate driving circuit 104 supplied to the gate lines G11 to G20 belonging to the second block B2.

A first output voltage of the first shift register SR1 is supplied to the OR gates 81 and 83 through the first AND gate 51, the first level shifter 52, the first buffer 53, and a first common line 45. The first common line 45 simultaneously supplies the first output voltage of the first shift register SR1 to first input terminals of the OR gates 81 and 83 connected to the first to tenth gate lines G1 to G10. First to tenth output voltages sequentially output from the second shift register SR2 are supplied to the second OR gate 83 through the second AND gate 61, the second level shifter 62, the second buffer 63, and a buffer output terminal 46.

Each of the OR gates 81 and 83 performs an OR operation on a first input through the first common line 45 and a second input through the buffer output terminal 46 and outputs a result of the OR operation to the first to tenth gate lines G1 to G10 belonging to the first block B1. The first shift register SR1 generates an output in the block driving mode, and the second shift register SR2 generates an output in the line sequential driving mode. Thus, in the block driving mode, the OR gates 81 and 83 supply the first output voltage of the first shift register SR1 to the first to tenth gate lines G1 to G10 belonging to the first block B1. On the other hand, in the line sequential driving mode, the OR gates 81 and 83 supply the output voltages sequentially received from the second shift register SR2 to the first to tenth gate lines G1 to G10.

A second output voltage of the first shift register SR1 is supplied to the OR gates 82 and 84 through the third AND gate 54, the third level shifter 55, a third buffer 56, and a second common line 47. The second common line 47 simultaneously supplies the second output voltage of the first shift register SR1 to first input terminals of the OR gates 82 and 84 connected to the eleventh to twentieth gate lines G11 to G20. Eleventh to twentieth output voltages sequentially output from the second shift register SR2 are supplied to the fourth OR gate 84 through the fourth AND gate 64, the fourth level shifter 65, a fourth buffer 66, and a buffer output terminal 48.

Each of the OR gates 82 and 84 performs an OR operation on a first input through the second common line 47 and a second input through the buffer output terminal 48 and outputs a result of the OR operation to the eleventh to twentieth gate lines G11 to G20 belonging to the second block B2. The first shift register SR1 generates an output in the block driving mode, and the second shift register SR2 generates an output in the line sequential driving mode. Thus, in the block driving mode, the OR gates 82 and 84 supply the second output voltage of the first shift register SR1 to the eleventh to twentieth gate lines G11 to G20 belonging to the second block B2. On the other hand, in the line sequential driving mode, the OR gates 82 and 84 supply the output voltages sequentially received from the second shift register SR2 to the eleventh to twentieth gate lines G11 to G20.

When the level shifters 52, 55, 62, and 65 (or denoted by "LS") are implemented as the GIP circuit as shown in FIG. 2, they are disposed at an input terminal of the gate driving circuit 104.

Figure 5:
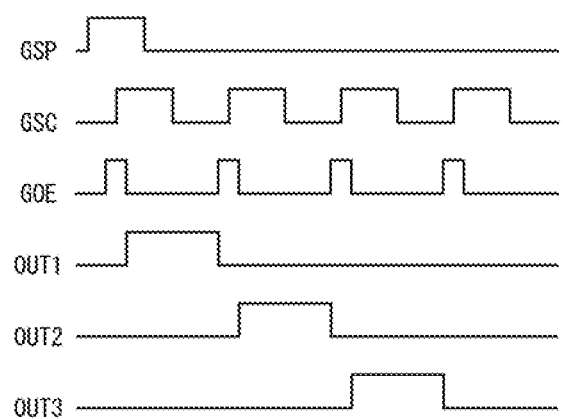
FIG. 5 is a waveform diagram showing an input and output waveform of a gate driving circuit in a line sequential driving mode according to an embodiment of the present invention.
Figure 6:
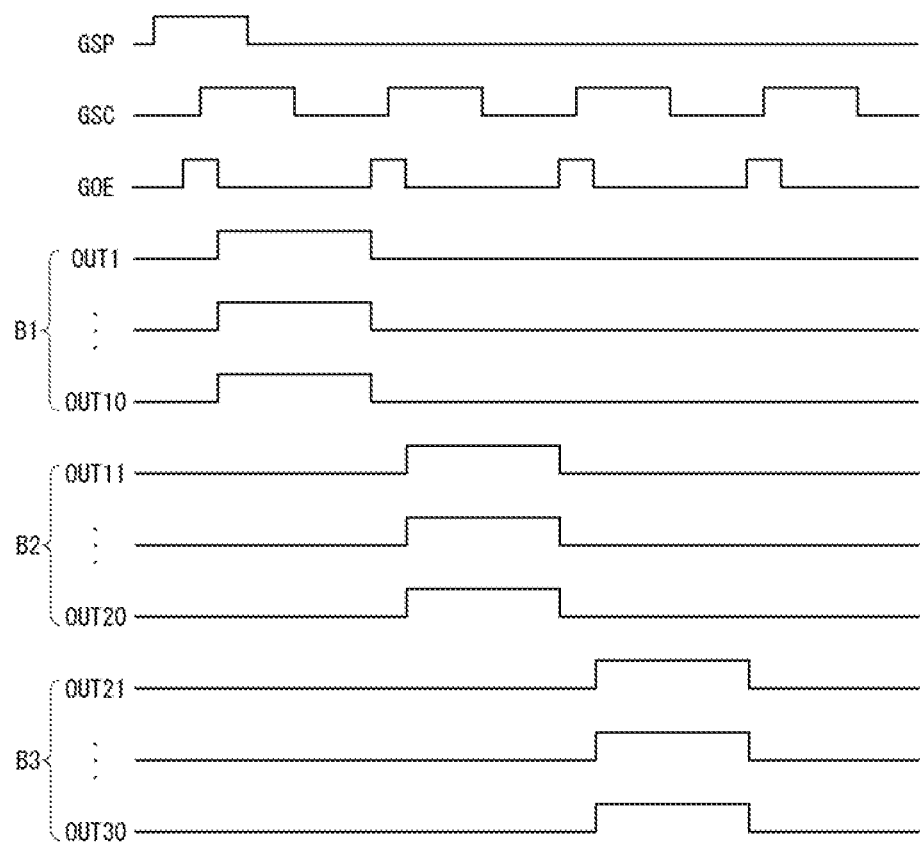
FIG. 6 is a waveform diagram showing an input and output waveform of a gate driving circuit in a block driving mode according to an embodiment of the present invention.
Figure 7:
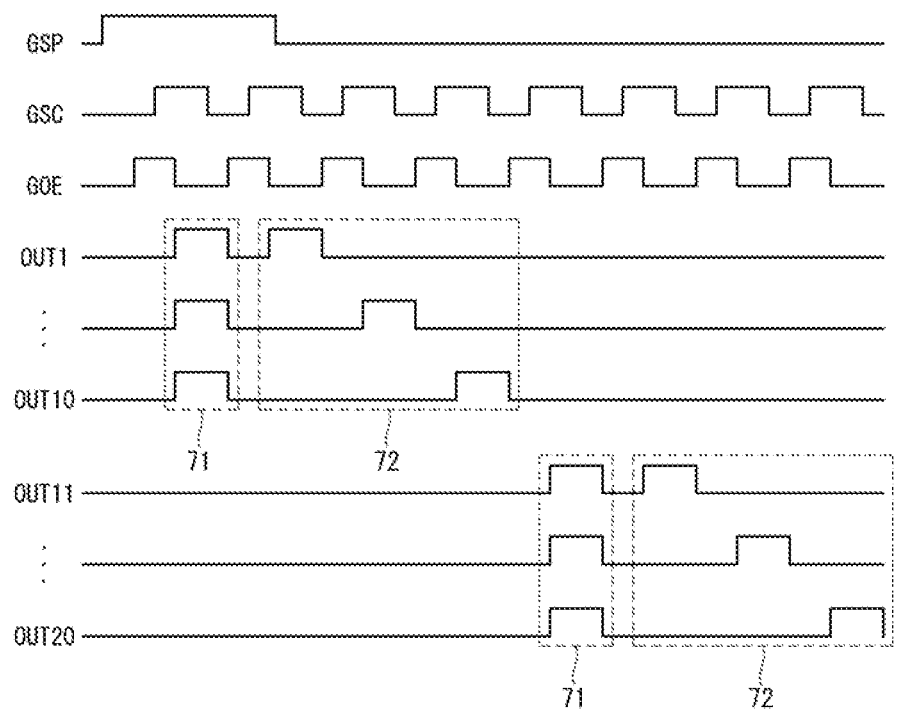
FIG. 7 is a waveform diagram showing an example where both a line sequential driving mode and a block driving mode are applied in one frame period according to an embodiment of the present invention.

FIG. 5 is a waveform diagram showing an input and output waveform of the gate driving circuit 104 in the line sequential driving mode. FIG. 6 is a waveform diagram showing an input and output waveform of the gate driving circuit 104 in the block driving mode. FIG. 7 is a waveform diagram showing an example where both the line sequential driving mode and the block driving mode are applied in one frame period.

In the line sequential driving mode, the gate pulses synchronized with the data voltage are sequentially supplied to the gate lines G1 to Gn on a per line basis. In the block driving mode, the gate pulses are sequentially supplied to the gate lines G1 to Gn on a per block basis. For example, in the block driving mode, the gate pulses are simultaneously output to the first to tenth gate lines G1 to G10, and then the gate pulses are simultaneously output to the eleventh to twentieth gate lines G11 to G20. Both the line sequential driving mode and the block driving mode may be applied together in one frame period.

The line sequential driving mode may be applied when data of the input image is written on the pixels. The block driving mode may be applied when the pixels are discharged or initialized on a per block basis, or when black data is written on the pixels in a 3D mode. Further, the block driving mode may be applied to sense changes in characteristic of the TFT as time passed. Further, the block driving mode may be applied when black data is written on the pixels disposed on a plurality of lines to obtain a black data insertion (BDI) effect, or when black data is inserted between a left eye image and a right eye image of a 3D image. As shown in FIG. 7, both a line sequential driving mode 71 and a block driving mode 72 may be applied together in one frame period. In this instance, the display panel 100 may be time-division driven in the line sequential driving mode 71 and the block driving mode 72 in one frame period.

The gate driving circuit shown in FIGS. 3 and 4 may be applied to the GIP circuit directly formed on the substrate of the display panel 100. In the GIP circuit, a location of the level shifter LS is changed as shown in FIG. 2. In the GIP circuit, the gate output enable signal GOE may be omitted.

As described above, the display device according to the embodiments of the invention selects the first and second shift registers based on the driving mode and may easily change an output method of the gate driving circuit.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A gate driving circuit comprising:
a first shift register configured to sequentially shift a gate start pulse in response to a gate shift clock and output a gate pulse shifted on a per block basis, each block including a plurality of gate lines;
a second shift register configured to sequentially shift the gate start pulse in response to the gate shift clock and output a gate pulse shifted on a per gate line basis; and
a controller configured to supply the gate shift clock to the first shift register in a block driving mode and supply the gate shift clock to the second shift register in a line sequential driving mode,
wherein a first output voltage of the first shift register is supplied to OR gates of a first block connected to a plurality of gate lines belonging to the first block through a first common line, wherein output voltages sequentially output from the second shift register are supplied to an OR gate of the first block, wherein a second output voltage of the first shift register is supplied to OR gates of a second block connected to a plurality of gate lines belonging to the second block through a second common line, and wherein output voltages sequentially output from the second shift register are supplied to an OR gate of the second block.

2. The gate driving circuit of claim 1, wherein the first shift register, the second shift register, and the controller are directly formed on a substrate of a display panel along with a pixel array of the display panel, or are integrated into one integrated circuit and are attached to the substrate of the display panel.

3. The gate driving circuit of claim 1, further comprising AND gates, level shifters, and buffers between the first and second shift registers and the OR gates of the first and second blocks.

4. The gate driving circuit of claim 1, wherein in the block driving mode, the controller sequentially supplies the gate pulse to the gate lines on a per block basis, and wherein in the line sequential driving mode, the controller sequentially supplies the gate pulse synchronized with a data voltage to the gate lines.

5. The gate driving circuit of claim 1, wherein the controller commonly supplies the gate start pulse to the first and second shift registers, and individually supplies the gate shift clock to the first and second shift registers based on the block driving mode and the line sequential driving mode.

6. The gate driving circuit of claim 1, wherein in the block driving mode, the gate pulses are simultaneously supplied to the gate lines in one block.

7. A display device comprising:
a display panel including a pixel array including pixels arranged in a matrix form based on a crossing structure of data lines and gate lines;
a first shift register configured to sequentially shift a gate start pulse in response to a gate shift clock and output a gate pulse shifted on a per block basis, each block including a plurality of gate lines;
a second shift register configured to sequentially shift the gate start pulse in response to the gate shift clock and output a gate pulse shifted on a per gate line basis; and
a controller configured to supply the gate shift clock to the first shift register in a block driving mode and supply the gate shift clock to the second shift register in a line sequential driving mode,
where in a first output voltage of the first shift register is supplied to OR gates of a first block connected to a plurality of gate lines belonging to the first block through a first common line, wherein output voltages sequentially output from the second shift register are supplied to an OR gate of the first block, wherein a second output voltage of the first shift register is supplied to OR gates of a second block connected to a plurality of gate lines belonging to the second block through a second common line, and wherein output voltages sequentially output from the second shift register are supplied to an OR gate of the second block.

8. The display device of claim 7, wherein the first shift register, the second shift register, and the controller are directly formed on a substrate of the display panel along with the pixel array, or are integrated into one integrated circuit and are attached to the substrate of the display panel.

9. The display device of claim 7, further comprising AND gates, level shifters, and buffers between the first and second shift registers and the OR gates of the first and second blocks.

10. The display device of claim 7, wherein in the block driving mode, the controller sequentially supplies the gate pulse to the gate lines on a per block basis, and wherein in the line sequential driving mode, the controller sequentially supplies the gate pulse synchronized with a data voltage to the gate lines.

11. The display device of claim 10, wherein when data of an input image is written on the pixels, the display panel is driven in the line sequential driving mode.

12. The display device of claim 11, wherein when the pixels are discharged or initialized on a per block basis, or when black data is written on the pixels, the display panel is driven in the block driving mode.

13. The display device of claim 11, wherein when changes in characteristics of thin film transistors formed in the pixels with the passage of time are sensed on a per block basis, the display panel is driven in the block driving mode.

14. The display device of claim 10, wherein the display panel is driven in the line sequential driving mode and the block driving mode in one frame period.

15. The display device of claim 7, wherein the controller commonly supplies the gate start pulse to the first and second shift registers, and individually supplies the gate shift clock to the first and second shift registers based on the block driving mode and the line sequential driving mode.

16. The display device of claim 7, wherein in the block driving mode, the gate pulses are simultaneously supplied to the gate lines in one block.

* * * * *